US006729898B1

(12) United States Patent
Lin et al.

(10) Patent No.: US 6,729,898 B1
(45) Date of Patent: May 4, 2004

(54) PERMANENTLY CONNECTED ELECTRICAL CONNECTOR ASSEMBLY

(75) Inventors: Hsien-Chu Lin, Tu-Chen (TW); Yun Long Ke, Tu-chen (TW); Chia Chung Lin, Tu-Chen (TW); Shih Tung Chang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/321,140

(22) Filed: Dec. 16, 2002

(30) Foreign Application Priority Data

Nov. 29, 2002 (TW) .................................... 91219304 U

(51) Int. Cl.[7] .......................................... H10R 13/627
(52) U.S. Cl. ...................................... 439/349; 439/578
(58) Field of Search ................................ 439/349, 350, 439/63, 675, 578

(56) References Cited

U.S. PATENT DOCUMENTS 2,761,111 A * 8/1956 Klostermann ............... 439/271
3,793,610 A * 2/1974 Brishka ...................... 439/349
3,915,539 A * 10/1975 Collins ....................... 439/275
4,072,386 A * 2/1978 Wallo ......................... 439/349
4,422,704 A * 12/1983 Williams ..................... 439/349
4,596,435 A * 6/1986 Bickford ..................... 439/582
5,074,809 A 12/1991 Rousseau
5,195,904 A * 3/1993 Cyvoct ....................... 439/349
5,288,242 A * 2/1994 Muzslay ..................... 439/349
5,611,707 A 3/1997 Meynier
5,637,010 A * 6/1997 Jost et al. .................... 439/352
5,938,465 A * 8/1999 Fox, Sr. ....................... 439/350
6,053,769 A * 4/2000 Kubota et al. ............... 439/578
6,224,421 B1 * 5/2001 Maturo, Jr. ................. 439/581
6,439,925 B1 8/2002 Lin et al.

* cited by examiner

*Primary Examiner*—Tho D. Ta
*Assistant Examiner*—Larisa Tsukerman
(74) *Attorney, Agent, or Firm*—Wei Te Chung

(57) ABSTRACT

An electrical connector assembly (5) for transmitting radio frequency signals includes a first electrical connector (1) and a second electrical connector (2). The first electrical connector includes a conductive outer shell (10), an insulator (not labeled) within the conductive outer shell, a first conductive terminal (11) and a locking ring (12) securely fixed on the conductive outer shell. The locking ring has an engaging surface (121) perpendicular to a horizontal centerline (A—A) of the conductive outer shell. The second electrical connector includes a metallic second shell (20), an insulative base (22), and a second conductive terminal (21). The second shell defines a groove (204) therein adjacent to a second mating face (206). An inner side surface (2040) of the groove adjacent to the second mating face is perpendicular to a horizontal centerline (B—B) of the second electrical connector. When the first electrical connector mates with the second electrical connector, the engaging surface of the first electrical connector securely engages with the inner side surface of the second electrical connector, making the mated connection permanent.

11 Claims, 3 Drawing Sheets

PERMANENTLY CONNECTED ELECTRICAL CONNECTOR ASSEMBLY

BACKGROUND OF THE INVENTION

1. Field of the Invention

The present invention generally relates to electrical connector assemblies, and more particularly to an electrical connector assembly with two complementary coaxial connectors.

2. Description of Prior Art

Microminiature coaxial (MCX) connectors generally act as antenna connectors to connect antennas with transmitters. A conventional MCX connector assembly is disclosed in U.S. Pat. No. 6,439,925 B1 issued to Lin et al. on Aug. 27, 2002. The MCX connector assembly includes a plug connector and a port connector. The plug connector includes a metallic first housing, a first insulator fixed in the first housing, and an elastic metallic sleeve secured between the first housing and the first insulator. The metallic sleeve forms a ridge on an outer periphery with a semi-circular cross-section. The port connector includes a hollow cylindrical second shell defining a groove with a semi-circular cross-section for engaging with the ridge of the plug connector. However, the arced surface of the ridge is easy to disengage from the convex inner surface of the groove, thus making the connection non-permanent.

Further, according to Title 47 of the Code of Federal Regulations (CFR) 15.203 and a public notice DA 00-1087 issued by the Federal Communications Commission (FCC) on May 22, 2000, an intentional radiator shall be designed to ensure that no antenna other than that furnished by the responsible party shall be used with the transmitter. Typically, a manufacturer will either design a unique antenna connector or will modify a commonly available connector to satisfy this requirement.

However, to a manufacturer, a unique antenna connector design may be expensive or unacceptable in the market, so a commonly available antenna connector which makes permanently may be preferred.

Hence, an improved electrical connector assembly is needed to eliminate the above-mentioned defects of the conventional MCX connector assembly.

BRIEF SUMMARY OF THE INVENTION

A main object of the present invention is to provide an electrical connector assembly with a locking ring for permanent mating between the two complementary connectors.

An electrical connector assembly according to the present invention, for using with an antenna includes a first electrical connector and a second electrical connector. The first electrical connector includes a metallic first shell, a first conductive terminal and a locking ring securely fixed in the metallic first shell. The locking ring has an engaging surface perpendicular to a horizontal centerline of the metallic first shell. The second electrical connector includes a metallic second shell, a second conductive terminal and a second mating face. The second shell defines a groove therein. An inner sidewall of the groove adjacent to the second mating face is perpendicular to a horizontal centerline of the second electrical connector. The engaging surface of the locking ring abuts against the inner sidewall of the groove when the first and second electrical connectors are mated together. By such arrangement, the first electrical connector permanently mates with the second electrical connector.

Other objects, advantages and novel features of the invention will become more apparent from the following detailed description of a preferred embodiment when taken in conjunction with the accompanying drawings.

DETAILED DESCRIPTION OF THE INVENTION

Figure 1:
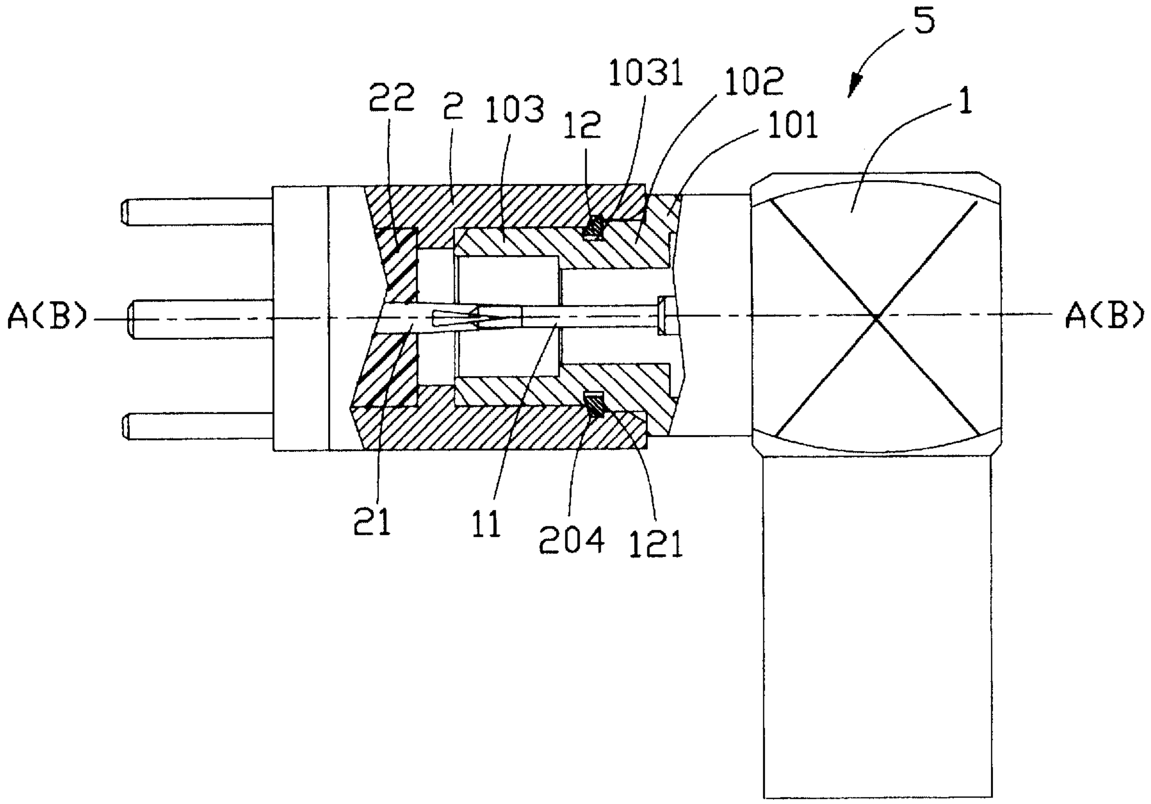
FIG. 1 is a partially cross-sectional view of an electrical connector assembly with a first and second electrical connectors coupled with each other in accordance with the present invention.

Referring to FIG. 1, an electrical connector assembly 5 of the present invention includes a first and a second electrical connectors 1, 2 coupled with each other for transmitting Radio Frequency (RF) signals.

Figure 2:
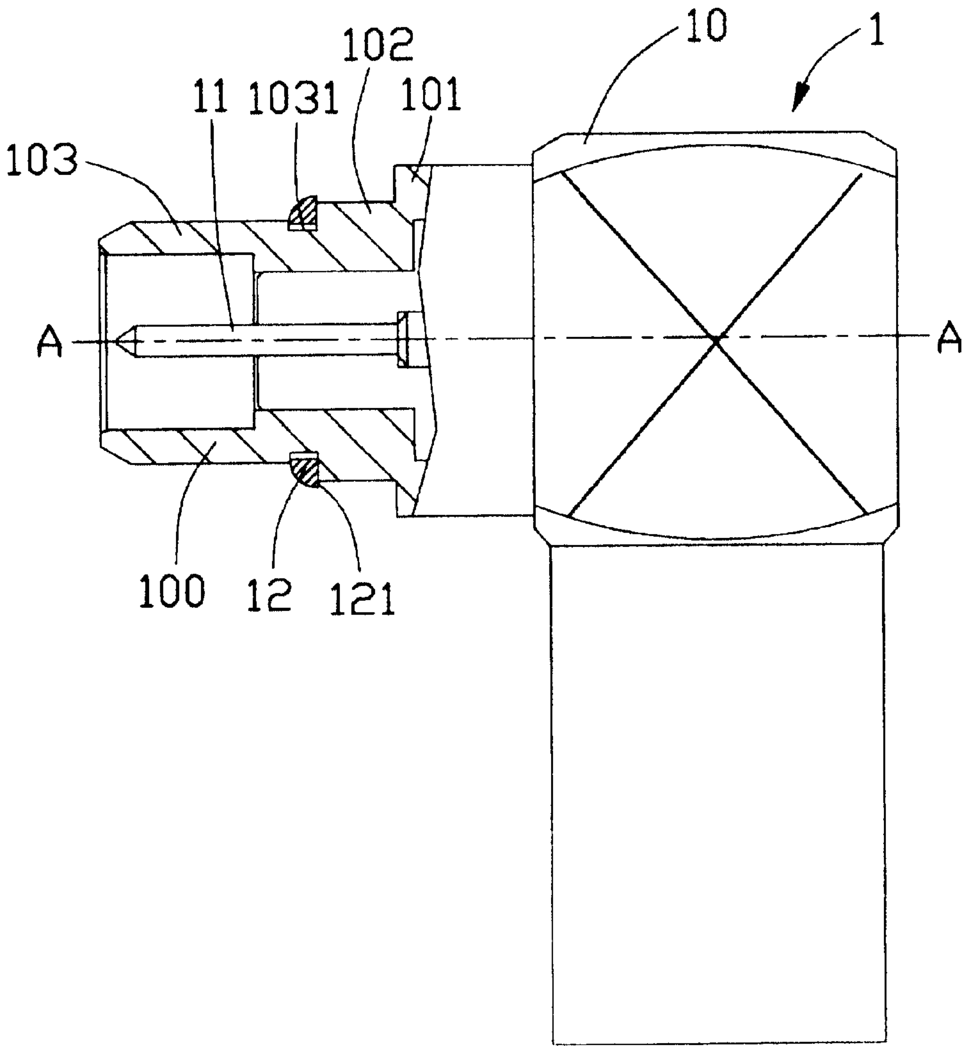
FIG. 2 is a partially cross-sectional view of the first electrical connector of FIG. 1.

Referring to FIG. 2, the first electrical connector 1 is a substantially L-shaped coaxial plug connector and has a first mating end (not labeled). The plug connector 1 includes an L-shaped cylindrical conductive outer shell 10, an insulator (not shown) secured in the first conductive outer shell 10, and a first conductive terminal 11 secured in the insulator. The conductive outer shell 10 includes a horizontal cylindrical metallic first shell, 100 having a horizontal centerline A—A, and a vertical shell (not labeled) perpendicular to the horizontal cylindrical metallic first shell 100. The insulator is secured at a juncture of the horizontal metallic first shell 100 and the vertical shell. The first conductive terminal 11 is preferably insert molded in the insulator and extends forwardly in the horizontal metallic first shell 100 and coaxial with the horizontal centerline A—A. The metallic first shell 100 has a stepped outer periphery and includes a base portion 101 adjacent to the vertical shell, having a largest outer diameter, a mating portion 103 having a least outer diameter, and a mid-portion 102 connecting the base portion 101 with the mating portion 103. The mating portion 103 defines an annular holding slot 1031 in an outer periphery adjacent to the mid-portion 102. A locking ring 12, having a quarter-circle cross-section, is securely fixed in the holding slot 1031. The locking ring 12 has a first locking surface or an engaging surface 121. The engaging surface 121 is oriented perpendicular to the horizontal centerline A—A when the locking ring 12 is fixed in the holding slot 1031. The engaging surface 121 abuts against and extends beyond an inner surface (not labeled) of the holding slot 1031, said inner surface defining a front face of the mid-portion 102. An arc-shaped leading surface (not labeled) of the locking ring 12 faces outwardly toward a free end of the mating portion 103.

Figure 3:
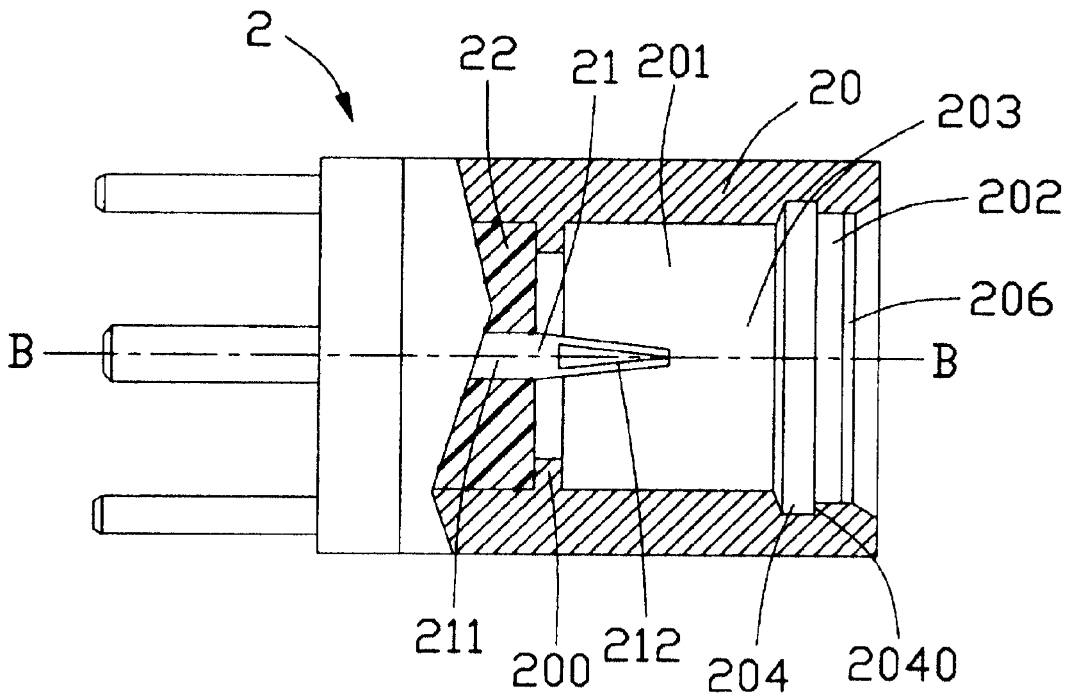
FIG. 3 is a partially cross-sectional view of the second electrical connector of FIG. 1.

Referring to FIG. 3, the second electrical connector 2 is a coaxial port connector which has a second mating face 206 and a horizontal centerline B—B. The coaxial port connector 2 includes a cylindrical metallic second shell 20, an insulative base 22 securely fixed in a rear portion of the metallic second shell 20, and a second conductive terminal 21 fixed in the insulative base 22. The metallic second shell 20 defines an annular rim 200 in an inner periphery thereof. An inner space of the metallic second shell 20 is divided into a holding room (not labeled) to a rear of the rim 200 and a receiving slot 203 communicating with the holding room by the rim 200. The insulative base 22 is received in the holding room and abuts against one side of the rim 200. The second conductive terminal 21 includes a holding portion 211 securely fixed in the insulative base 22 and a connection portion 212 extending forwardly into the receiving slot 203 of the metallic second shell 20 and coaxial with the horizontal centerline B—B for electrically engaging with the first conductive terminal 11.

An inner periphery about the receiving slot 203 of the metallic second shell 20 has a profile stepped with a first and a second cavities 201, 202 corresponding to the outer profile of the mating portion 103 and the mid-portion 102, respectively. An annular groove 204 is defined in an inner portion of the metallic second shell 20 corresponding to the locking ring 12 of the coaxial plug connector 1. The groove 204 has a second locking surface or an inner side surface 2040. The inner side surface 2040 is adjacent to the second cavity 202 and is perpendicular to the horizontal centerline B—B. An angle between an opposite inclined side surface (not labeled) and the centerline B—B is an acute angle.

Referring to FIGS. 1–3, the metallic first shell 100 of the first electrical connector 1 is inserted into the receiving slot 203 through the second mating face 206 of the second electrical connector 2. The horizontal centerline A—A is coaxial with the horizontal centerline B—B. The first terminal 11 mechanically and electrically connect with the second terminal 21. The arc-shaped leading surface of the locking ring 12 slides into the groove 204. The engaging surface 121 of the locking ring 12 abuts against the inner side surface 2040 of the groove 204 thereafter. A front end of the mating portion 103 abuts against the rim 200. A front portion of the base portion 101 abuts against a front end of the second shell 20. Since the engaging surface 121 and the inner side surface 2040 are both perpendicular to the horizontal centerlines A—A and B—B, it is difficult for the engaging surface 121 to unmate from the inner side surface 2040 and to slide out of the groove 204, therefore the plug and the port connectors 1, 2 are permanently connected together.

In preferred embodiment above, the locking ring 12 is secured in the holding slot 1031 defined in the outer periphery of the first shell 100. It is conceivable that the locking ring 12 can be made integrally molded with the outer periphery of the first shell 100.

It is to be understood, however, that even though numerous, characteristics and advantages of the present invention have been set forth in the foregoing description, together with details of the structure and function of the invention, the disclosed is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly comprising:

a first electrical connector including:

a metallic first shell having a first centerline and a first mating end, the metallic first shell including a locking ring secured thereon, the locking ring having an engaging surface which is oriented opposite to a the first mating end of the metallic first shell and perpendicular to said first centerline;

an insulator retained in the metallic first shell; and a first conductive terminal secured in the insulator; and a second electrical connector including:

a metallic second shell having a second centerline and a second mating end, the metallic second shell including a receiving slot and defining a groove therein, the groove having an inner side surface perpendicular to said second centerline and facing away from the second mating end of the metallic second shell;

an insulative base retained in the metallic second shell; and a second conductive terminal secured in the insulative base; wherein, when the first electrical connector mates with the second electrical connector, a mating portion of the metallic first shell inserts into the receiving slot of the metallic second shell, the first and second conductive terminals electrically connect, and the engaging surface of the locking ring abuts against the inner side surface of the groove of the metallic second shell, particularly connecting the first and second electrical connectors together; wherein the first connector and the second connector are permanently connected together by abutment between the engaging surface of the locking ring and the inner side surface of the second shell.

2. The electrical connector assembly as claimed in claim 1, wherein the metallic first shell defines a holding slot in an outer periphery of the metallic first shell for securely retaining the locking ring on the metallic first shell.

3. The electrical connector assembly as claimed in claim 2, wherein the locking ring has a quarter-circle cross-section and has an arc-shaped leading surface which is oriented toward the first mating end of the first electrical connector when the locking ring is assembled in the holding slot of the first electrical connector.

4. The electrical connector assembly as claimed in claim 1, wherein the metallic second shell defines a first and a second receiving cavities therein, and the groove is arranged between the first and the second receiving cavities.

5. A coaxial connector comprising:

a metallic shell having a horizontal centerline and a mating end, the metallic shell having a rigid locking ring securely fixed in an outer surface of the metallic shell, the locking ring having a generally quarter-circle cross-section and including an engaging surface perpendicular to said horizontal centerline and oriented opposite to the mating end of the metallic shell, and an arc-shaped leading surface oriented toward the mating end, when the locking ring is assembled to the metallic shell;

an insulator received in the metallic shell;

a conductive terminal secured in the insulator and extending forwardly for electrically connecting with terminal of a mating connector.

6. The coaxial connector as claimed in claim 5, wherein the metallic shell defines a holding slot therein for retaining the locking ring.

7. The coaxial connector as claimed in claim 6, wherein the metallic shell is a substantially hollow cylinder and comprises a base portion, a mid-portion and a mating portion, and said holding slot is arranged in the mating portion adjacent to the mid-portion.

8. A coaxial connector assembly comprising:

a first connector including;

a first metallic tubular shell having a first mating end and enclosing a first insulative housing having a first contact therein;

a first annular vertical locking surface formed on an interior face of the first shell and facing away from said first mating end;

a second connector including:

a second metallic tubular shell having a second mating end and enclosing a second insulative housing having a second contact therein, said second shell being dimensioned compliant received in the first shell;

a second annular vertical locking surface formed around an exterior face of the second shell and facing away from the second mating end;

a tapered annular guiding surface formed around said exterior face of the second shell and closely in front of said second locking surface, and facing toward the second opening; wherein when assembled, the first locking surface is latchably engaged with the second locking surface under a condition that said first connector and said second connector are permanently assembled together by latchable engagement between the first locking surface and the second locking surface.

9. The assembly as claimed in claim 8, wherein said tapered guiding surface and second locking surface are provided by a locking ring which retainably while discretely surroundings the second shell.

10. The assembly as claimed in claim 9, wherein an annular groove is formed on the exterior face of the second shell to receive said locking ring.

11. The assembly as claimed in claim 10, wherein said locking ring is dimensioned to be able to radially inwardly deformed in said annular groove when the second shell is inserted into the first shell.

* * * * *